US009548255B1

(12) United States Patent
Ge et al.

(10) Patent No.: US 9,548,255 B1
(45) Date of Patent: Jan. 17, 2017

(54) IC PACKAGE HAVING NON-HORIZONTAL DIE PAD AND FLEXIBLE SUBSTRATE THEREFOR

(71) Applicant: FREESCALE SEMICONDUCTOR, INC., Austin, TX (US)

(72) Inventors: You Ge, Tianjin (CN); Meng Kong Lye, Shah Alam (MY); Zhijie Wang, Tinajin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 15/139,331

(22) Filed: Apr. 27, 2016

Related U.S. Application Data

(63) Continuation-in-part of application No. 14/850,966, filed on Sep. 11, 2015, now Pat. No. 9,379,035.

(30) Foreign Application Priority Data

Aug. 17, 2015 (CN) .......................... 2015 1 0624670

(51) Int. Cl.
*H01L 23/52* (2006.01)
*H01L 23/367* (2006.01)
(Continued)

(52) U.S. Cl.
CPC ....... *H01L 23/3672* (2013.01); *H01L 21/4853* (2013.01); *H01L 21/4882* (2013.01); *H01L 21/54* (2013.01); *H01L 21/565* (2013.01); *H01L 23/16* (2013.01); *H01L 23/3114* (2013.01); *H01L 23/4985* (2013.01); *H01L 23/49811* (2013.01); *H01L 23/49838* (2013.01); *H01L 25/0655* (2013.01); *H01L 25/50* (2013.01)

(58) Field of Classification Search
CPC .... H01L 23/3672; H01L 23/367; H01L 23/16; H01L 23/3114; H01L 23/49811; H01L 23/49838; H01L 23/4985; H01L 23/053; H01L 23/49541; H01L 23/49568; H01L 23/49575; H01L 24/49; H01L 24/85; H01L 25/065; H01L 25/0655; H01L 25/50; H01L 21/4853; H01L 21/4882; H01L 21/56; H01L 21/565
USPC ........................................................ 257/692
See application file for complete search history.

(56) References Cited

U.S. PATENT DOCUMENTS 6,677,624 B2    1/2004  Ihm
7,722,211 B2 *  5/2010  Marra ................. F21S 48/1394
                                                    362/227

(Continued)

*Primary Examiner* — Tu-Tu Ho
(74) *Attorney, Agent, or Firm* — Charles E. Bergere

(57) ABSTRACT

An integrated circuit (IC) package has a base, side walls mechanically connected to the base, IC dies respectively mounted on inner surfaces of the side walls or the base, and electrical connections connecting a corresponding IC die to another component of the IC package. In one embodiment, each die is electrically connected to only bond pads on its corresponding side wall or base. Each such side wall and the base have routing structures (e.g., copper traces) that connect each bond pad to another component of the IC package. The IC package is assembled using a flexible substrate that has side regions that rotate relative to the base such that the routing structures do not break. By connecting an IC die only to bond pads on its corresponding side wall or base with bond wires, the bond wires will not break during side-wall rotation.

19 Claims, 15 Drawing Sheets

(51) Int. Cl.
    *H01L 23/498*    (2006.01)
    *H01L 23/31*     (2006.01)
    *H01L 23/16*     (2006.01)
    *H01L 25/065*    (2006.01)
    *H01L 21/56*     (2006.01)
    *H01L 25/00*     (2006.01)
    *H01L 21/48*     (2006.01)
    *H01L 21/54*     (2006.01)

(56) References Cited

U.S. PATENT DOCUMENTS

| | | |
|---|---|---|
| 7,972,650 B1 | 7/2011 | Church et al. |
| 8,323,607 B2 | 12/2012 | Liu et al. |
| 8,552,542 B2 | 10/2013 | Morioka |
| 9,379,035 B1 * | 6/2016 | Ge ................... H01L 23/367 |
| 2007/0155064 A1 | 7/2007 | Chen et al. |
| 2008/0094835 A1 * | 4/2008 | Marra ................ F21S 48/1394 |
| | | 362/247 |
| 2009/0194869 A1 | 8/2009 | Eom et al. |
| 2011/0237002 A1 * | 9/2011 | Church ............. H01L 21/4867 |
| | | 438/7 |
| 2012/0256305 A1 | 10/2012 | Kaufmann et al. |
| 2013/0082376 A1 | 4/2013 | Nagarkar et al. |
| 2013/0093073 A1 | 4/2013 | Chen et al. |
| 2015/0022088 A1 * | 1/2015 | Gershowitz ........ H05B 33/0842 |
| | | 315/113 |

* cited by examiner

IC PACKAGE HAVING NON-HORIZONTAL DIE PAD AND FLEXIBLE SUBSTRATE THEREFOR

This is a continuation-in-part of application Ser. No. 14/850,966, filed on Sep. 11, 2015, now U.S. Pat. No. 9,379,035, the disclosure of which is incorporated herein by reference in its entirety.

BACKGROUND

The present invention relates to integrated circuit packaging and, more particularly, to IC packages having more than one integrated circuit die.

A conventional three-dimensional (3D) integrated circuit (IC) package has a vertical stack of two or more IC dies and one or more interposers mounted below the stack of dies and/or between dies within the stack. One problem with such conventional 3D IC packages relates to the inability to effectively dissipate heat generated by dies located in the interior of the stack (i.e., dies other than the bottom-most and top-most dies in the stack). Accordingly, it would be advantageous to have a 3D IC package with good heat dissipation properties.

BRIEF DESCRIPTION OF THE DRAWINGS

Other embodiments of the invention will become more fully apparent from the following detailed description, the appended claims, and the accompanying drawings in which like reference numerals identify similar or identical elements.

FIG. 18 is a top plan view of the flexible substrate of FIG. 17 after (i) molding compound has been applied and (ii) the flexible substrate has been punched through;

DETAILED DESCRIPTION

Figure 1:
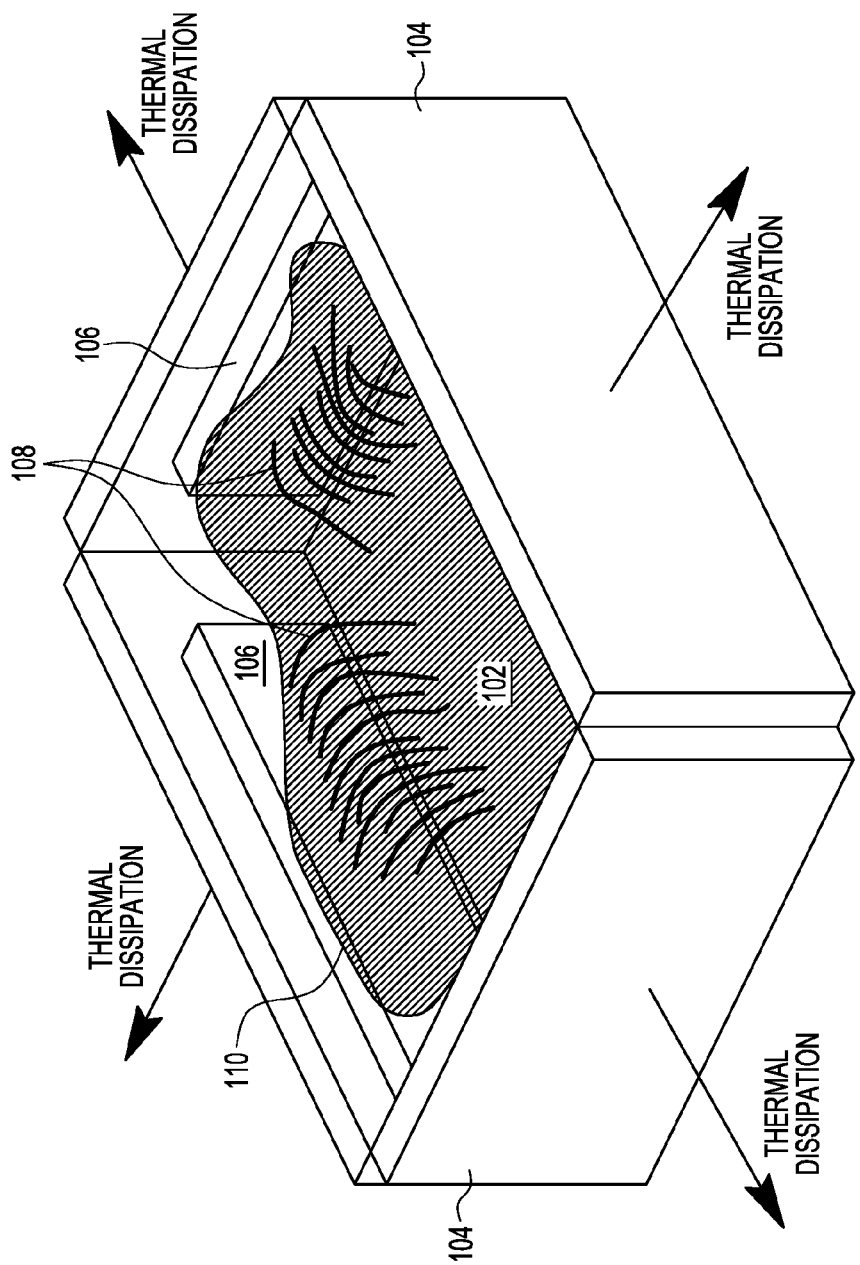
FIG. 1 is a perspective view of an IC package according to one embodiment of the invention.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, an IC package comprises a base, a plurality of side walls mechanically connected to the base, a plurality of IC dies, each mounted on an inner surface of a side wall or the base, and a plurality of electrical connections that connect a corresponding IC die to another component of the IC package.

Another embodiment is a flexible substrate for an IC package. The flexible substrate comprises (a) a base region having (i) a plurality of routing structures and (ii) a plurality of I/O pads and (b) a plurality of side regions flexibly connected to and co-planar with the base region. At least one side region has (i) a plurality of bond pads and (ii) a plurality of routing structures electrically connecting the bond pads to the routing structures of the base region. The routing structures of the base region electrically connect the routing structures of the at least one side region to at least one of (i) routing structures of one or more other side regions and (ii) I/O pads on a bottom surface of the base region. The side regions are rotatable relative to the base region to form side walls of an IC package without breaking any electrical connections between the routing structures in the base region and the routing structures in the at least one side region.

Another embodiment is a method for assembling an IC package. The method comprises (a) providing the flexible substrate of the previous paragraph; (b) mounting each of a plurality of IC dies onto a side region or the base region; (c) electrically connecting each mounted IC die only to a plurality of bond pads on the corresponding side region or base region with bond wires; and (d) rotating the side regions relative to the base region to form side walls of the IC package. Another embodiment is the IC package assembled using this method.

FIG. 1 is a perspective view of an IC package 100 according to one embodiment of the invention. The IC package 100 has a three-dimensional rectilinear shape defined by an interposer 102 at its base and four metal (e.g., copper) side walls 104. Although not shown in FIG. 1 and as described further below with respect to FIGS. 12 and 13, the IC package 100 may have an optional metal cap which forms the top of the IC package 100. Mounted on the inner surface of each side wall 104 is an IC die 106 that has wires 108 providing electrical connections to the interposer 102. As such, the side walls 104 function as die pads that receive the mounted dies 106. Some or all of the interior space within the IC package 100 is filled with a gel 110 (or other suitable encapsulating material) that encapsulates the wires 108 and holds the side walls 104 in place.

Because each die 106 is mounted on its own metal side wall 104 of the IC package 100, each side wall 104 functions as a heat sink that helps to dissipate heat generated by the mounted die 106 away from the IC package 100. Although not shown in FIG. 1, a heat sink may be connected to each side wall 104 to further enhance heat dissipation from the IC package 100. In this way, the IC package 100 can provide more-effective thermal dissipation than a corresponding conventional 3D IC package having four analogous dies mounted in a conventional vertical stack.

FIGS. 2 through 13 represent different stages of one possible technique for assembling the IC package 100 of FIG. 1.

Figure 2:
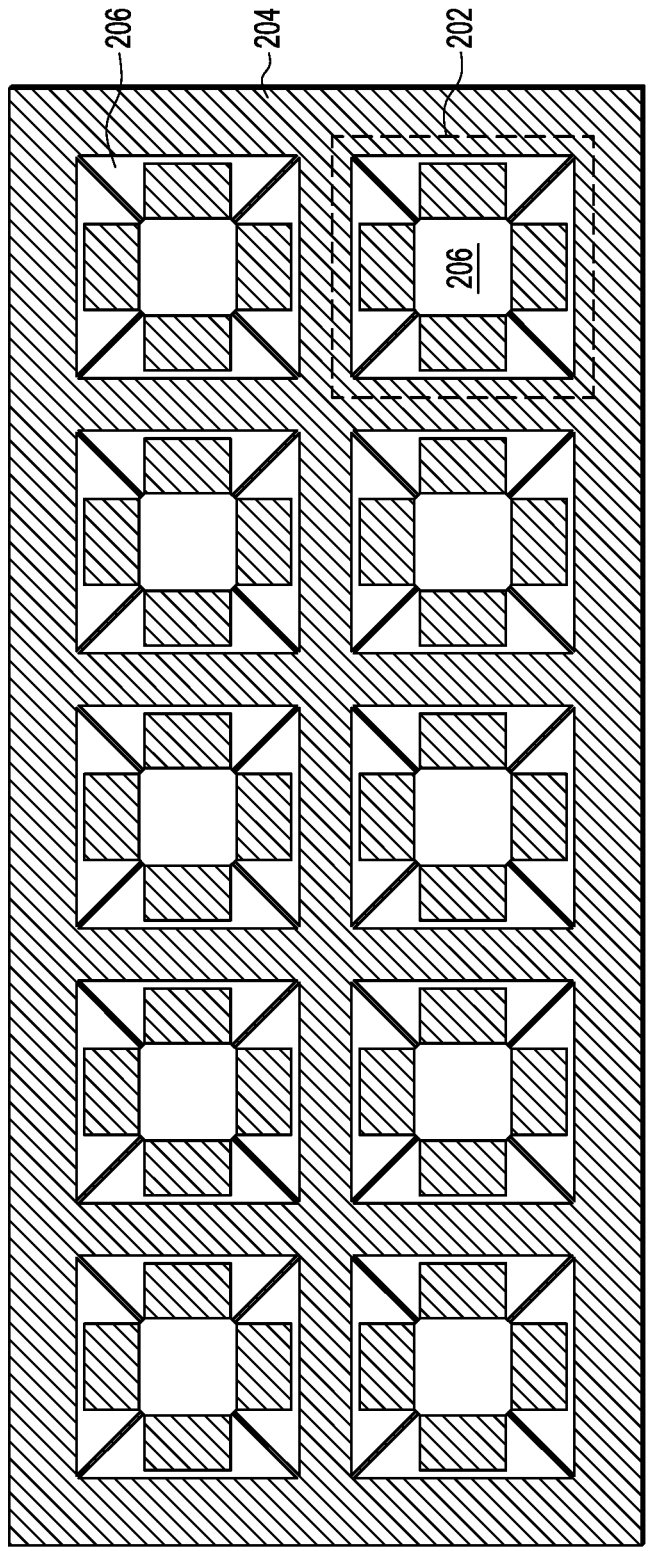
FIG. 2 is a plan view of a two-dimensional lead frame array according to one embodiment of the invention having ten lead frames within an array frame, where the ten lead frames can be used to assemble ten different instances of the IC package of FIG. 1.

FIG. 2 is a plan view of an example, two-dimensional, metal (e.g., copper) lead frame array 200 according to one embodiment of the invention having ten lead frames 202 within an array frame 204, where the ten lead frames 202 can be used to assemble ten different instances of the IC package 100 of FIG. 1. The lead frame array 200 is mounted on adhesive tape 206 that provides mechanical support for the various structural elements of the ten lead frames 202.

Figure 3:
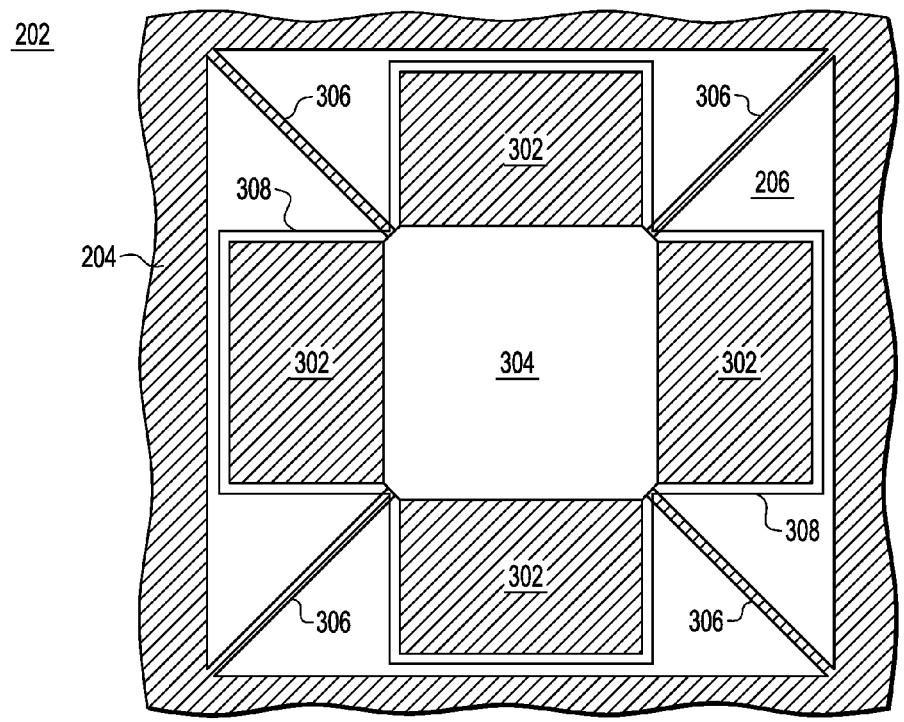
FIG. 3 is a plan view of one of the ten lead frames of FIG. 2 mounted on a corresponding portion of adhesive tape.

FIG. 3 is a plan view of one of the ten lead frames 202 of FIG. 2 mounted on a corresponding portion of the adhesive tape 206. As shown in FIG. 3, the lead frame 202 has four, rectangular, metal die pads 302 surrounding a rectangular (in this case, square) central opening 304 which exposes a corresponding portion of the adhesive tape 206. The lead frame 202 also has four diagonal tie bars 306, each of which is pivotally connected at one end to the corners of the two adjacent die pads 302 and at the other end to the array frame 204 to provide mechanical support between the die pads 302 and the rest of the lead frame array 200 until the adhesive tape 206 can be applied (e.g., between the time of the manufacture (e.g., by stamping) of the lead frame array 200 and its subsequent mounting onto the adhesive tape 206).

As indicated by label 308 in FIG. 3, the adhesive tape 206 is scored or otherwise cut around the periphery of the four die pads 302. In one implementation, the adhesive tape 206 is scored prior to the lead frame array 200 being mounted onto the adhesive tape 206. As described further below, this scoring enables the die pads 302 to be rotated out of the plane of the lead frame array 200 during the assembly process.

Figure 4:
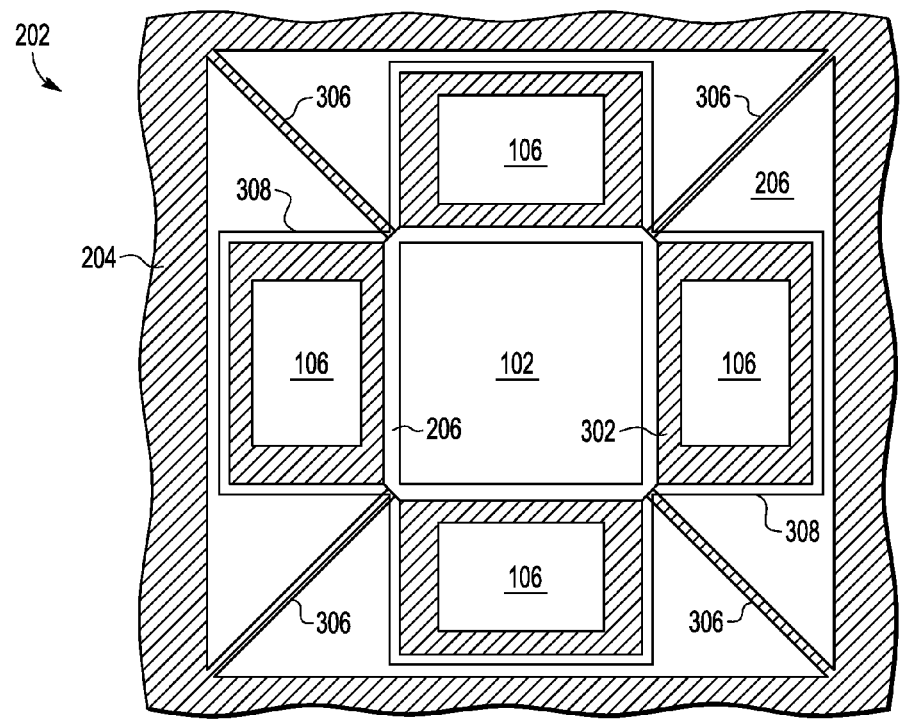
FIG. 4 is a plan view of the lead frame of FIG. 3 after (i) an interposer has been mounted onto the portion of the adhesive tape corresponding to a central opening in the lead frame and (ii) four dies have been mounted onto four die pads of the lead frame.

FIG. 4 is a plan view of the lead frame 202 of FIG. 3 after (i) the interposer 102 has been mounted onto the portion of the adhesive tape 206 corresponding to the central opening 304 in the lead frame 202 and (ii) the four dies 106 have been mounted onto the four die pads 302, e.g., using conventional pick-and-place machinery and a suitable thermally conductive epoxy (not shown).

Figure 5:
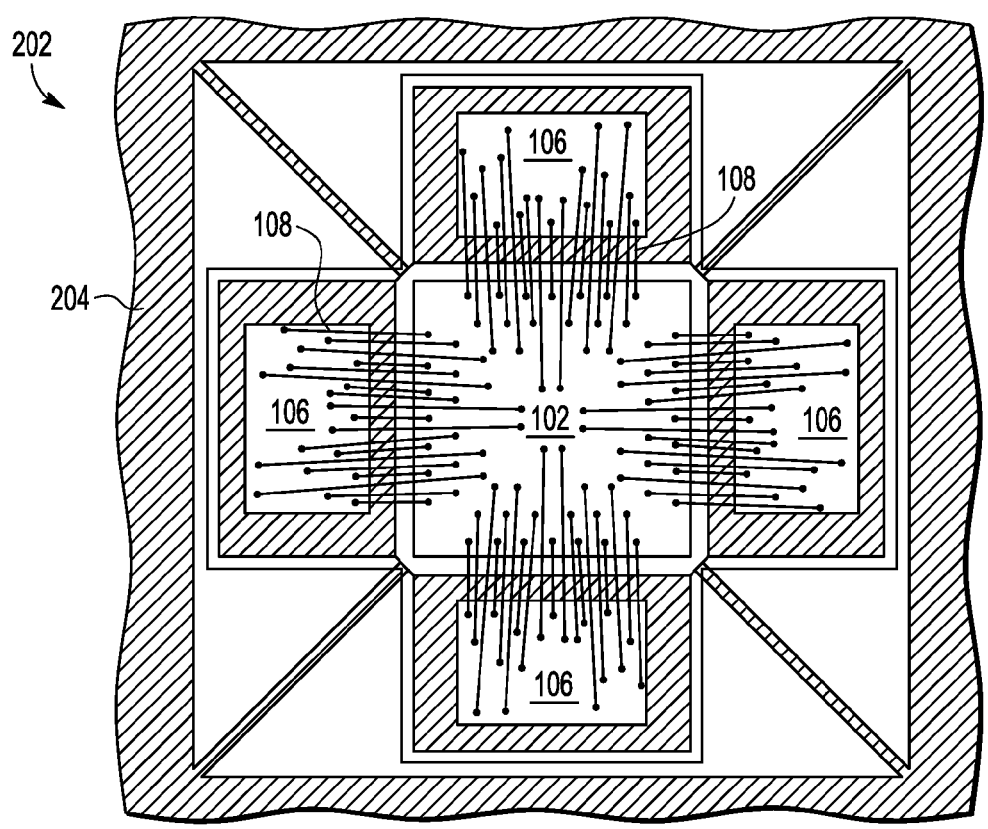
FIG. 5 is a plan view of the partial assembly of FIG. 4 after bond wires have been connected between the die and an interposer.

FIG. 5 is a plan view of the partial assembly of FIG. 4 after the wires 108 have been connected between each die 106 and the interposer 102. Depending on the particular implementation, the wires 108 may include insulated bond wires, insulated ribbon wires, insulated (e.g., carbon) nanotubes, and/or other suitable electrical connectors.

Figure 6:
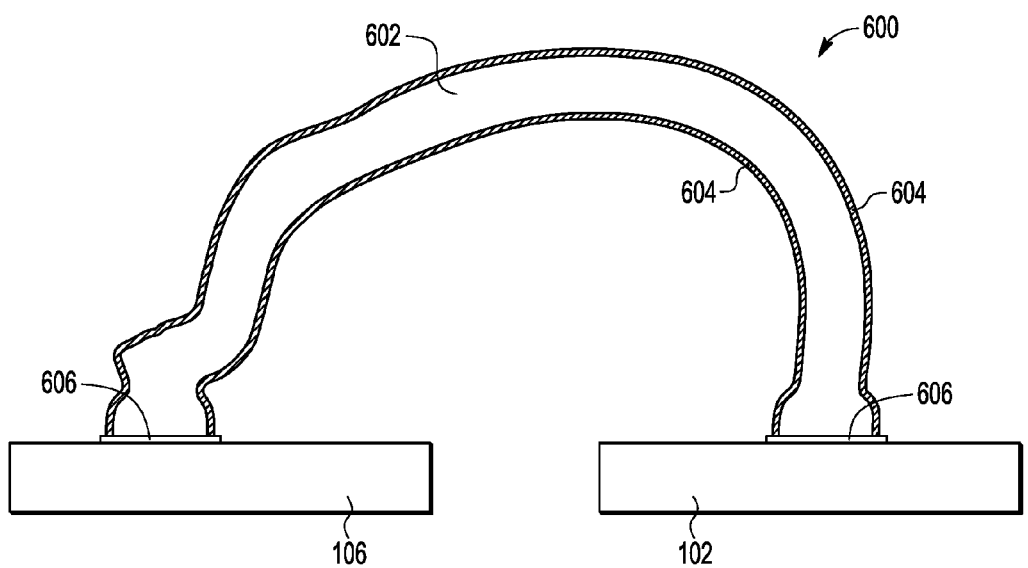
FIG. 6 is a cross-sectional side view of an insulated bond wire used as one of the wires of FIGS. 1 and 5 to connect the interposer to one of the dies.

FIG. 6 is a cross-sectional side view of an insulated bond wire 600 used as one of the wires 108 of FIGS. 1 and 5 to connect the interposer 102 to one of the dies 106. Bond wire 600 has a flexible conducting (e.g., metal) core 602 surrounded by a flexible, insulating outer sheath 604. As shown in FIG. 6, the bond wire 600 is wire-bonded (i.e., electrically connected with bond wires) at one end to a die pad 606 on the interposer 102 and at the other end to a corresponding die pad 606 on the die 106.

Figure 7:
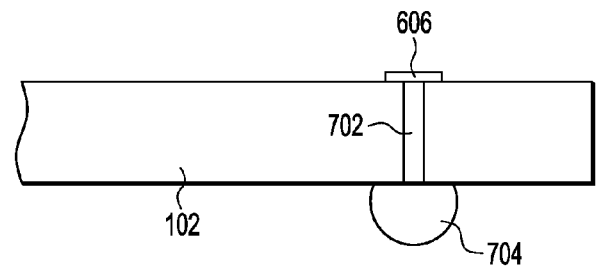
FIG. 7 is a cross-sectional side view of a portion of the interposer of FIG. 6 showing a through-silicon via (TSV) electrically connecting a die pad (to which the bond wire is connected) to a solder ball located on a bottom surface of the interposer.

FIG. 7 is a cross-sectional side view of a portion of the interposer 102 of FIG. 6 showing a through-silicon via (TSV) 702 electrically connecting the die pad 606 (to which the bond wire 600 is wire-bonded) to a solder ball 704 located on the bottom surface of the interposer 102, which is also the bottom surface of the IC package 100 of FIG. 1 when the IC package 100 is assembled using bond wires such as the bond wire 600.

Figure 8:
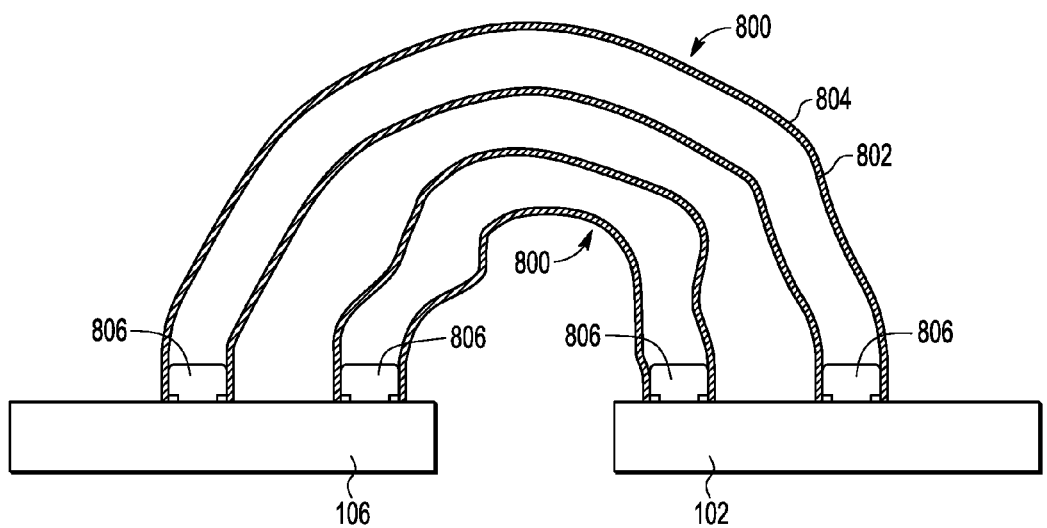
FIG. 8 is a cross-sectional side view of two insulated nanotubes used as two of the wires of FIGS. 1 and 5 to connect the interposer to one of the dies.

FIG. 8 is a cross-sectional side view of two insulated nanotubes 800 used as two of the wires 108 of FIGS. 1 and 5 to connect the interposer 102 to one of the dies 106. Each nanotube 800 is a flexible, hollow tube having a conducting inner surface 802 and an insulating outer surface 804. As shown in FIG. 8, each nanotube 800 is connected at one end to a wafer-level bump 806 on the interposer 102 and at the other end to a corresponding wafer-level bump 806 on the die 106. During bonding at a suitably high temperature, the nanotube diameter increases sufficiently to enable the ends of the nanotubes 800 to be inserted over the corresponding wafer-level bumps 806. As the temperature decreases, the nanotube diameter will also decrease, thereby securing the ends of the nanotubes 800 onto the wafer-level bumps 806.

Figure 9:
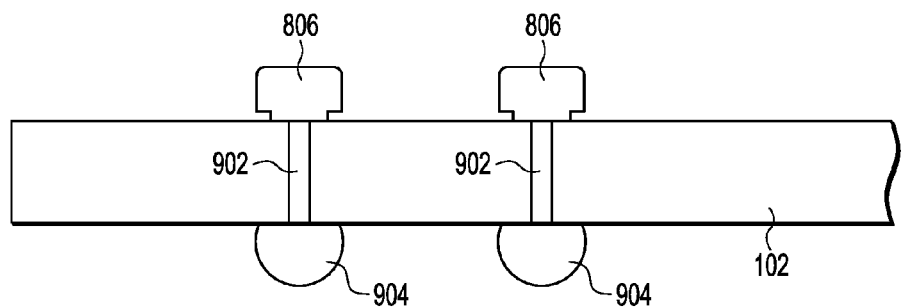
FIG. 9 is a cross-sectional side view of a portion of the interposer of FIG. 8 showing two TSVs electrically connecting wafer-level bumps (to which the nanotubes are connected) to two solder balls located on the bottom surface of the interposer.

FIG. 9 is a cross-sectional side view of a portion of the interposer 102 of FIG. 8 showing two TSVs 902 electrically connecting the wafer-level bumps 806 (to which the nanotubes 800 are connected) to two solder balls 904 located on the bottom surface of the interposer 102, which is also the bottom surface of the IC package 100 of FIG. 1 when the IC package 100 is assembled using nanotubes such as the nanotubes 800.

Although the wires 108 (i.e., the bond wire 600 of FIG. 6 and the nanotubes 800 of FIG. 8) are depicted in FIGS. 7 and 9 as being electrically connected to the solder balls 704 and 904 of the interposer 102 by vertical TSVs 702 and 902, in other implementations of the interposer 102, some or all of those electrical connections may be made using metal traces (not shown) within the interposer 102 that provide a fan-out function for the IC package 100. Furthermore, some metal traces (not shown) may provide electrical connections between two different wires 108 for chip-to-chip electrical connections rather than the TSV-based chip-to-solder-ball electrical connections of FIGS. 7 and 9.

Figure 10:
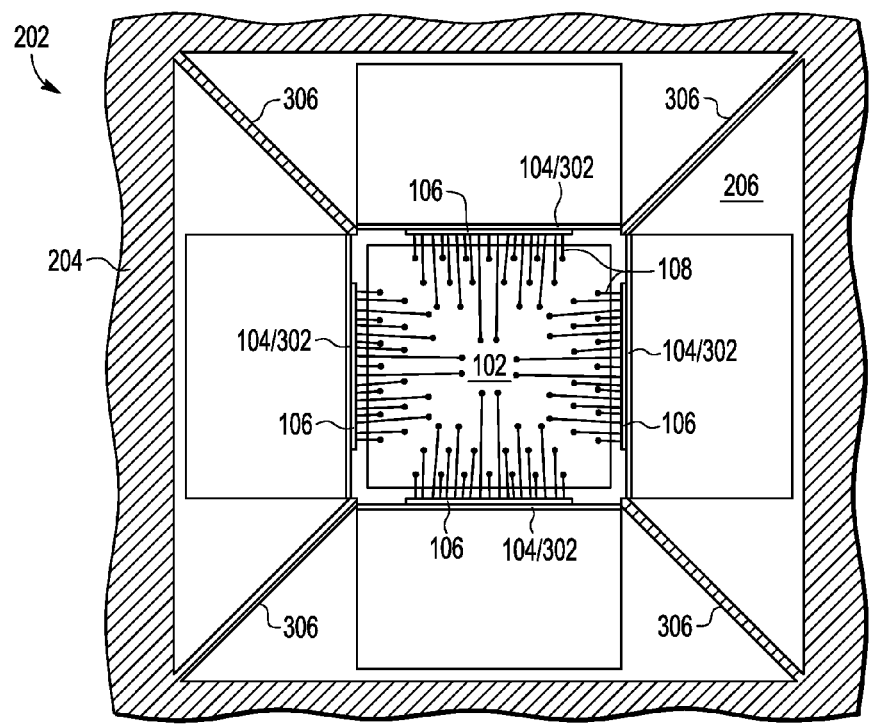
FIG. 10 is a plan view of the partial assembly of FIG. 5 after the four die pads have been rotated to be vertical relative to the plane of the lead frame array.

FIG. 10 is a plan view of the partial assembly of FIG. 5 after the four die pads 302 have been rotated 90 degrees (i.e., bent up at the pivotal connections to the four lead frame bars 306) to be vertical relative to the plane of the lead frame array 200. In one implementation, special tooling (not shown) is used to rotate the die pads 302 and their mounted dies 106 and corresponding portions of the scored, attached adhesive tape 206 while holding the interposer 102 in place, e.g., using a vacuum tool. As shown in FIG. 10, the four, now vertical mounted dies 106 maintain their electrical connections to the interposer 102 by virtue of the flexibility of the interconnecting, insulated wires 108. In one implementation, the rotation of the four die pads 302 causes the eight physical connections to the four tie bars 306 to break, thereby freeing the die pads 302 from the rest of the structure of the lead frame array 200. Note that the four die pads 302 are rotated to form the four vertical side walls 104 of the IC package 100 of FIG. 1.

Figure 11:
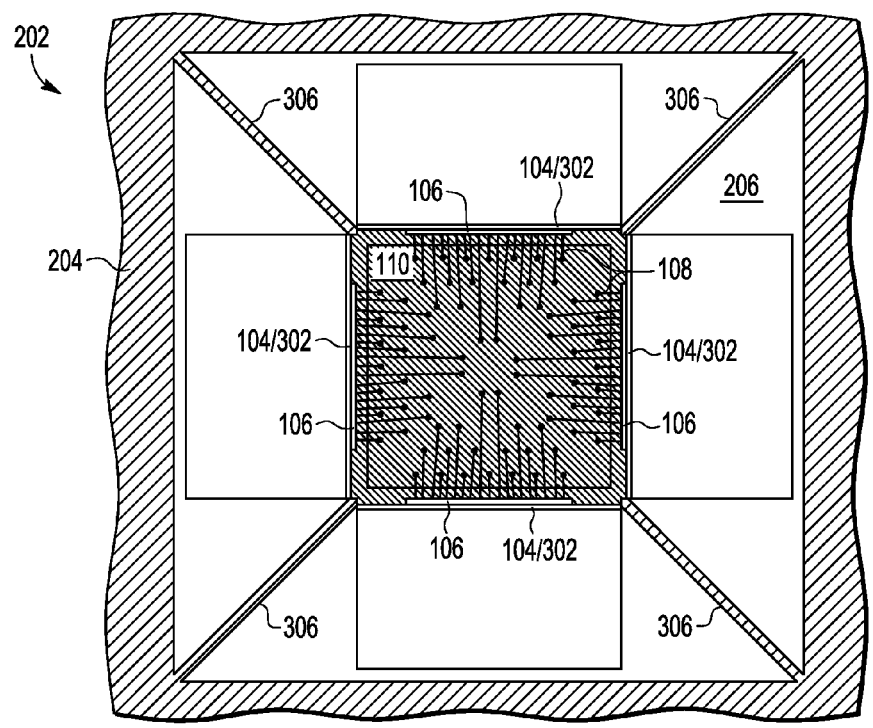
FIG. 11 is a plan view of the partial assembly of FIG. 10 after gel has been dispensed into the cavity defined by the interposer and the four vertical side walls formed by the die pads.

FIG. 11 is a plan view of the partial assembly of FIG. 10 after the gel 110 has been dispensed into the cavity defined by the interposer 102 and the four vertical side walls 104 formed by the rotated die pads 302. As described previously, the gel 110, which can be any suitable encapsulating material, encapsulates the wires 108 and holds the rotated die pads 302 in place.

Figure 13:
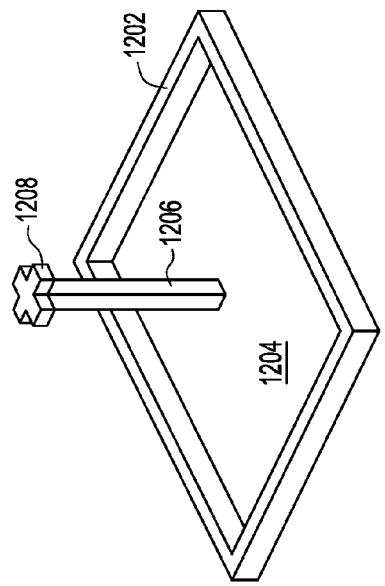
FIG. 13 is an upside-down, perspective view of the metal cap of FIG. 12.
Figure 12:
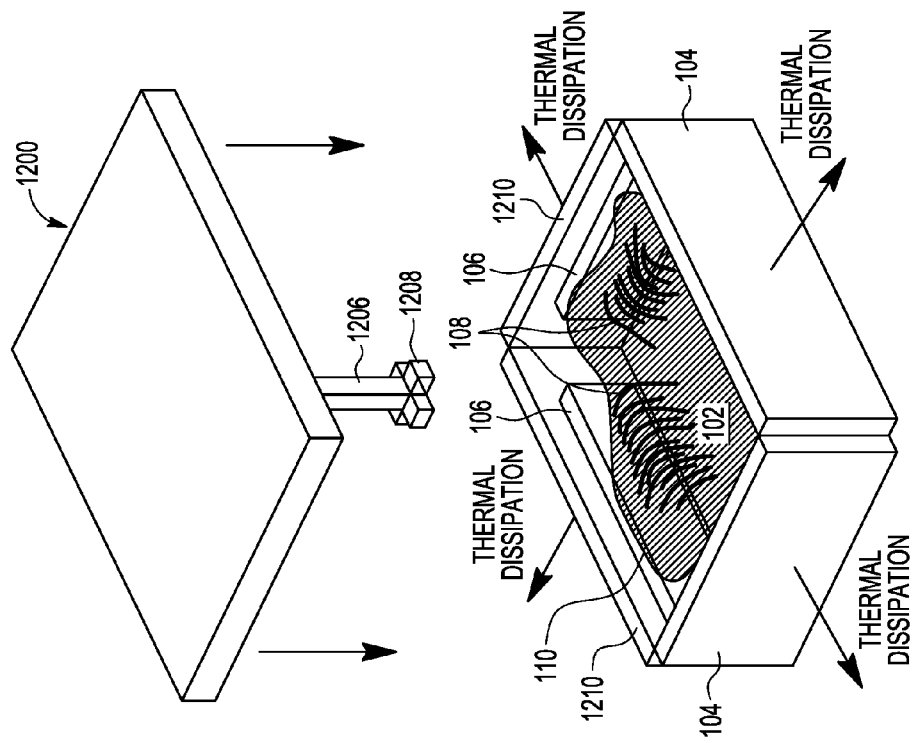
FIG. 12 is a perspective view showing an optional, rectangular, metal cap being placed over the assembly of FIG. 11.

FIG. 12 is a perspective view showing an optional, rectangular, metal cap 1200 being placed over the assembly of FIG. 11. FIG. 13 is an upside-down, perspective view of the metal cap 1200 of FIG. 12. As shown in FIG. 13, the metal cap 1200 has a rectangular outer rim 1202 defining an inner volume 1204 of the cap 1200 and a post 1206 having an anchor structure 1208 at its distal end. The outer rim 1202 is designed such that the upper edge 1210 of each rotated die pad 302 fits within the inner volume 1204 of the cap 1200 with the outer rim 1202 hanging over the outer surface of each upper edge 1210.

The metal cap 1200 is placed over the assembly of FIG. 11 before the gel 110 is completely cured such that the post 1206 extends into the gel 110 with the anchor structure 1208 submerged within the gel 110. After the gel 110 has been cured, the anchor structure 1208 and the post 1206 will permanently secure the cap 1200 in place on top of the IC package 100.

Whether or not the cap 1200 is used, after the gel 110 has been sufficiently cured, e.g., by baking and/or irradiating, the resulting assembly can be subjected to UV radiation to weaken the adhesive of the adhesive tape 206 to enable removal of the portions of the adhesive tape 206 from the bottom of the interposer 102 and the outer surfaces of the four die pads 302, thereby forming the completed IC package 100.

Figure 14:
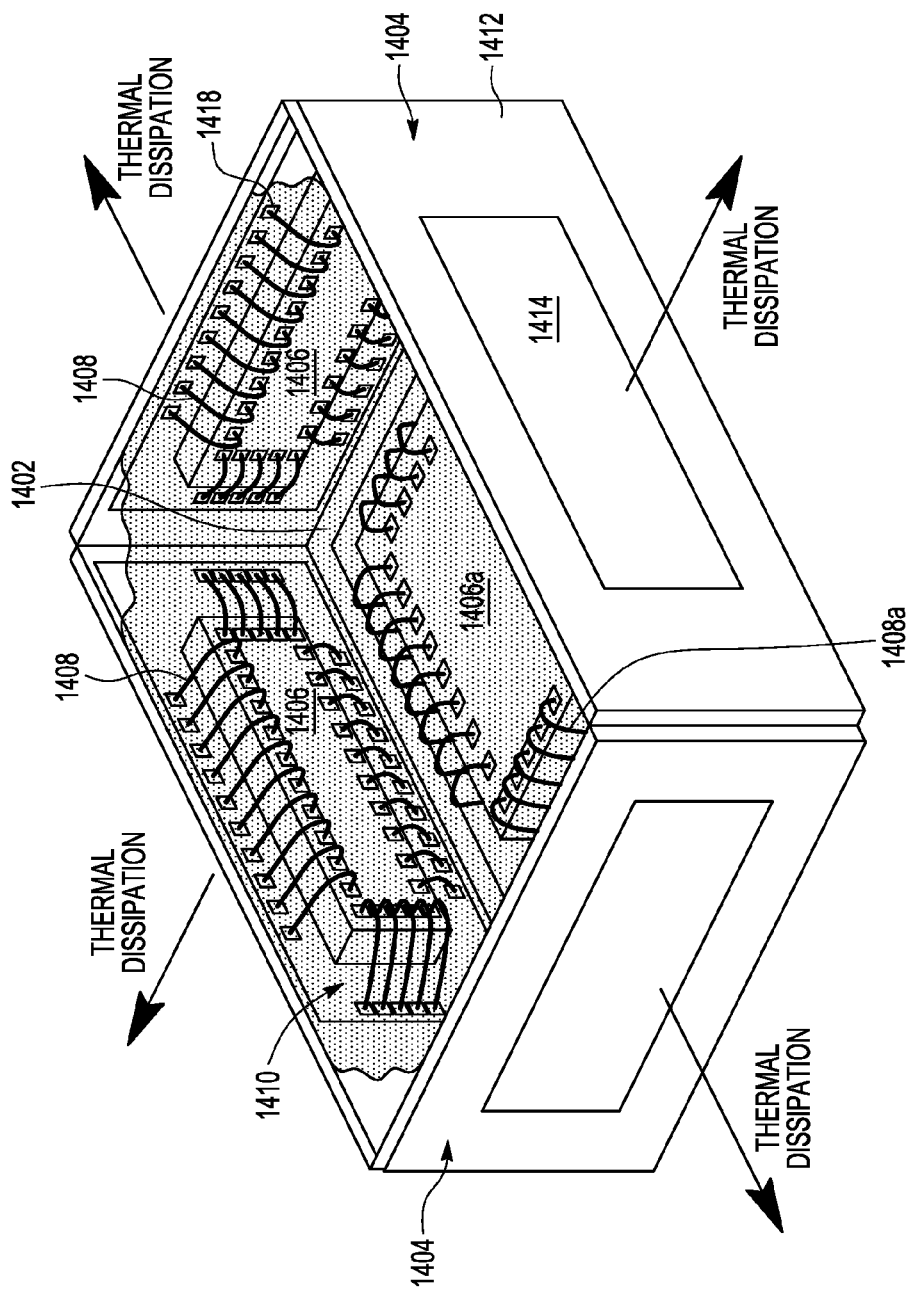
FIG. 14 is a perspective view of an IC package according to another embodiment of the invention.

FIG. 14 is a perspective view of an IC package 1400 according to another embodiment of the invention. The IC package 1400 is similar to the IC package 100 of FIG. 1 in at least the following ways, (i) the IC package 1400 has a three-dimensional rectilinear shape defined by a base 1402 and four side walls 1404, (ii) the IC package 1400 may include an optional metal cap (not shown), similar to the metal cap 1200 of FIG. 12, which would form the top of the IC package 1400, (iii) mounted on the inner surface of each side wall 1404 is an IC die 1406, where the side walls 1404 function as die pads that receive the mounted dies 1406, and (iv) some or all of the interior space within the IC package 1400 is filled with a gel 1410 (or other suitable encapsulating material) that holds the side walls 1404 in place.

As described in further detail below, the IC package 1400 is different from the IC package 100 of FIG. 1 in at least the following ways (i) unlike the interposer 102 of FIG. 1, which is a discrete component that gets mounted on the adhesive tape 206 below the central opening 304 in the lead frame 202, the base 1402 of FIG. 14 is part of a flexible substrate (1502 of FIG. 15) used to assemble the IC package 1400, (ii) unlike side walls 104 of FIG. 1, which are solid metal structures, each side wall 1404 comprises a non-conducting matrix 1412 having a rectangular, metal (e.g., copper) die pad region 1414 that extends from the outer surface of the side wall 1404 to its inner surface onto which the corresponding IC die 1406 is mounted. Each side wall 1404 also has, on its inner surface, a number of bond pads 1418 surrounding the metal die pad region 1414 that enable wire bonding to bond pads on the corresponding IC die 1406. Although not shown in FIG. 14, each side wall 1404 also has metal routing structures (1602 of FIG. 16B) that provide electrical connections to corresponding routing structures in the base 1402, (iii) the IC package 1400 has a fifth IC die 1406a mounted onto a rectangular, metal (e.g., copper) die pad region (1414a of FIG. 16A) on the inner surface of the base 1402 and electrically connected to bond pads 1418a on the inner surface of the base 1402 via bond wires 1408a, and (iv) unlike the bond wires 108 of the IC package 100, which connect bond pads on the four side-wall-mounted IC dies 106 directly to bond pads on the interposer 102, the bond wires 1408 connect bond pads on the four side-wall-mounted IC dies 1406 only to the bond pads 1418 on the corresponding side walls 1404, and the bond wires 1408a connect bond pads on the base-mounted fifth IC die 1406a only to the bond pads 1418a on the base 1402. These bond wires 1408, 1408a and the routing structures of the base 1402 and the side walls 1404 enable inter-die signal transmissions between the different IC dies 1406, 1406a as well as package signal transmissions between the IC package 1400 and the outside world.

Because each of the four dies 1406 is mounted on the metal die pad region 1414 of its own side wall 1404 of the IC package 1400, each side wall 1404 functions as a heat sink that helps to dissipate heat generated by the mounted die 1406 away from the IC package 1400. Although not shown in FIG. 14, a heat sink may be connected to each side wall 1404 to further enhance heat dissipation from the IC package 1400. The base 1402 also provides heat-dissipation functionality for the base-mounted, fifth IC die 1406a. In these ways, analogous to the IC package 100 of FIG. 1, the IC package 1400 can provide more-effective thermal dissipation than a corresponding conventional 3D IC package having five analogous dies mounted in a conventional vertical stack.

Furthermore, as described further below, because the already-wire-bonded bond wires 1408, 1408*a* are not subject to additional bending when the side walls 1404 are rotated from their original, horizontal orientation to their final, vertical orientation relative to the base 1402 during assembly of the IC package 1400, there may be less likelihood of those bond wires 1408, 1408*a* breaking during that package-assembly process than the bond wires 108 of the IC package 100.

FIGS. 15 through 20 represent different stages of one possible technique for assembling the IC package 1400 of FIG. 14.

Figure 15:
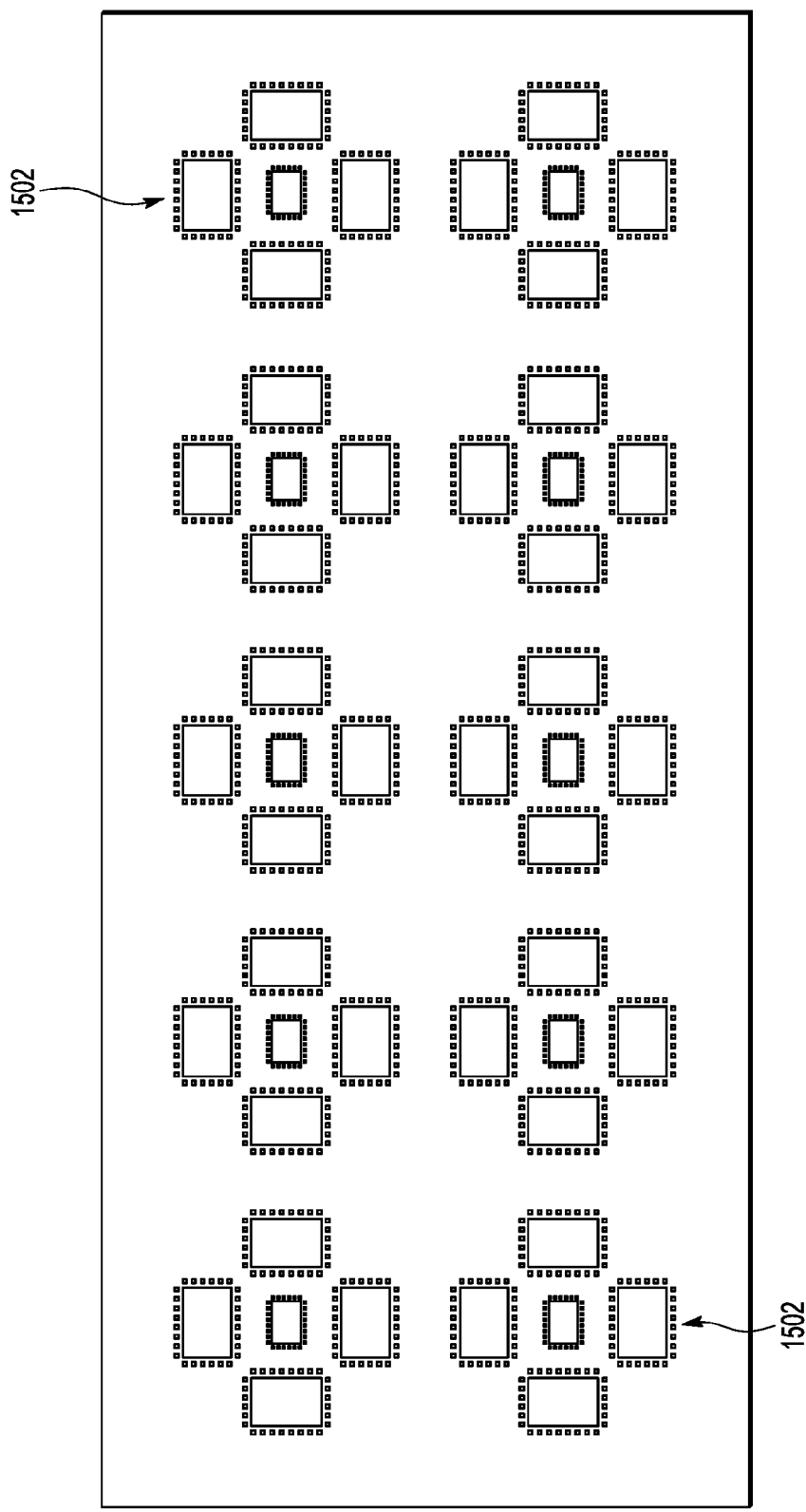
FIG. 15 is a top plan view of an example, two-dimensional, flexible substrate array.

FIG. 15 is a top plan view of an example, two-dimensional, flexible substrate array 1500 according to one embodiment of the invention having ten flexible substrates 1502 that can be used to assemble ten different instances of the IC package 1400 of FIG. 14.

Figure 16B:
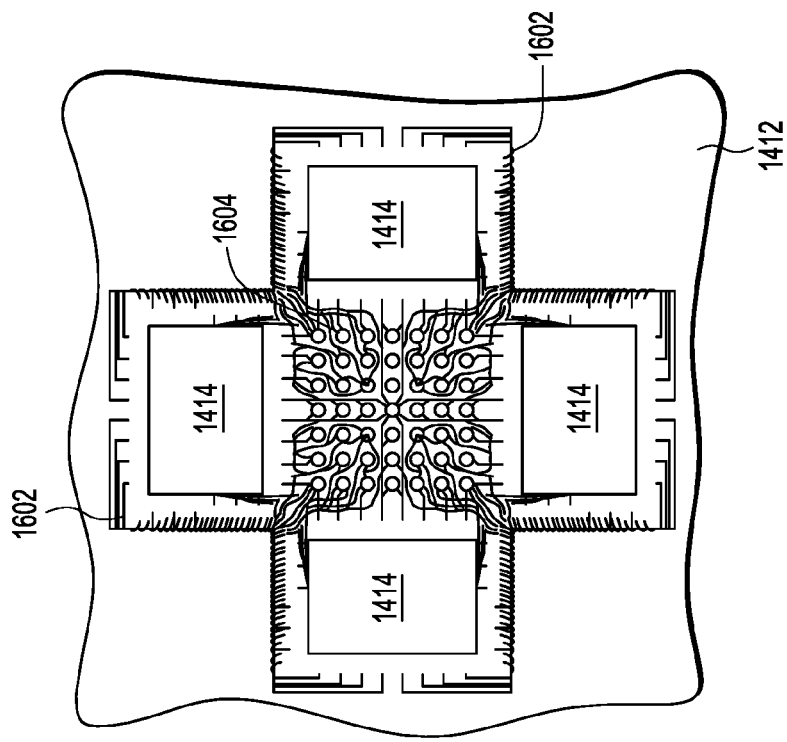
FIGS. 16A and 16B are top and bottom plan views, respectively, of one of the ten flexible substrates of FIG. 15.
Figure 16A:
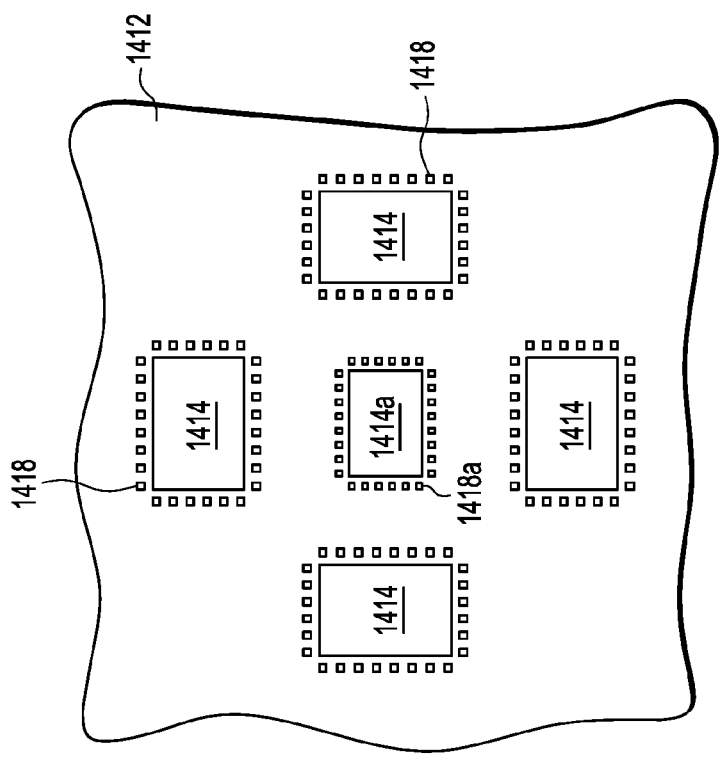

FIGS. 16A and 16B are top and bottom plan views, respectively, of one of the ten flexible substrates 1502 of FIG. 15. As shown in FIG. 16A, formed within the non-conducting matrix 1412 of the flexible substrate 1502 is the central, rectangular, metal die pad region 1414*a* surrounded by the four, rectangular, metal die pad regions 1414, where each metal die pad region 1414, 1414*a* is itself surrounded by metal bond pads 1418, 1418*a*. Each bond pad 1418, 1418*a* is formed on top of a metal via (not shown) that extends to one or more metal routing structures (e.g., copper traces) 1602 located internal to the flexible substrate and/or on the bottom surface of the flexible substrate 1502. The routing structures 1602 provide electrical connections from the vias of specific bond pads 1418, 1418*a* to either the vias of other specific bond pads 1418, 1418*a* or specific input/output (I/O) (e.g., solder ball) pads 1604 on the bottom surface of the flexible substrate 1502 or both. Those skilled in the art will understand that the routing structures form part of one or more redistribution layers (RDLs) that provide at least some of the functions of the interposer 102 of the IC package 100.

Note that the four die pad regions 1414 extend through the flexible substrate 1502 from the top surface of FIG. 16A to the bottom surface of FIG. 16B, while the central die pad region 1414*a* does not.

Figure 16C:
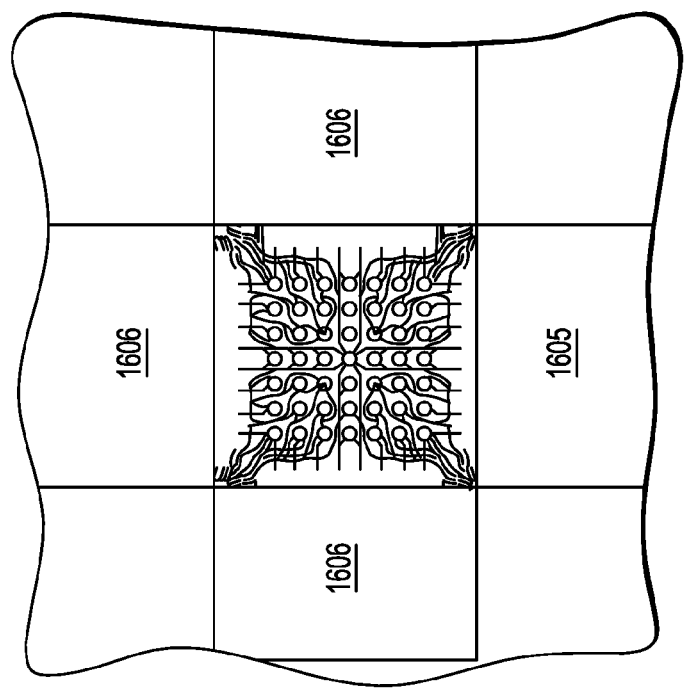
FIG. 16C is a bottom plan view of the flexible substrate of FIG. 16B with a metal stiffener element applied.

FIG. 16C is a bottom plan view of the flexible substrate 1502 of FIG. 16B with a metal (e.g., copper, aluminum, stainless steel) stiffener element 1606 applied to the bottom surface below each die pad region 1414 to provide additional mechanical support during the assembly process. In some embodiments, these stiffener elements 1606 will be removed before the assembly of the final IC package 1400 is complete. In other embodiments, they form permanent elements of the IC package 1400.

The non-conducting matrix 1412 can be made of any suitable, sufficiently flexible, electrically insulating material, such as a polymer like polyimide or polyether ether ketone. The flexible substrate 1502 may have additional optional layers for purposes of rigidity, insulation, and/or protection.

Figure 17:
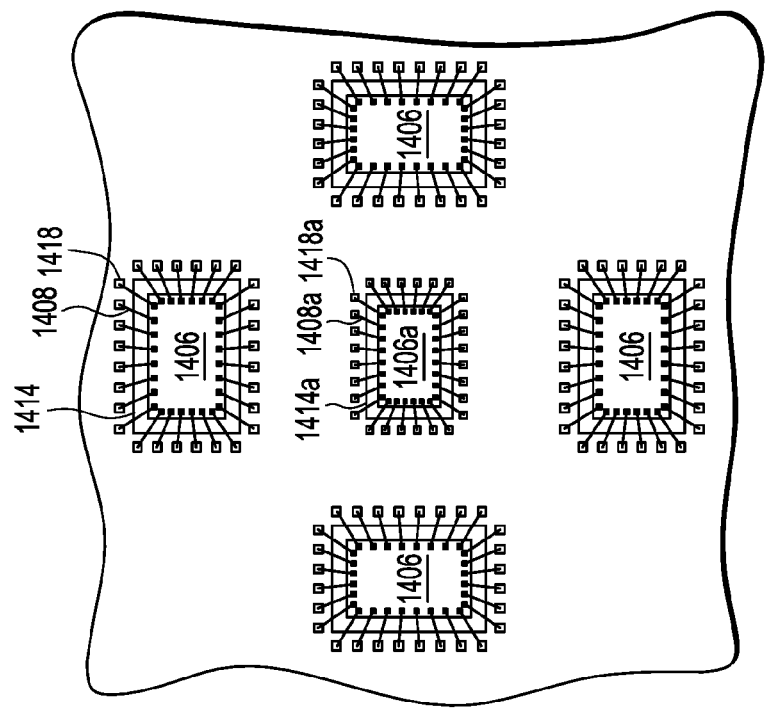
FIG. 17 is a top plan view of the flexible substrate of FIG. 16A after five dies have been mounted and wire-bonded.

FIG. 17 is a top plan view of the flexible substrate 1502 of FIG. 16A after the five dies 1406, 1406*a* have been (i) mounted onto the five corresponding die pad regions 1414, 1414*a*, e.g., using conventional pick-and-place machinery and a suitable thermally conductive epoxy (not shown) and (ii) wire-bonded using bond wires 1408, 1408*a* to corresponding, surrounding bond pads 1418, 1418*a*. Depending on the particular implementation, the bond wires 1408, 1408*a* may include insulated or uninsulated bond wires, ribbon wires, (e.g., carbon) nanotubes, and/or other suitable electrical connectors.

Figure 18:
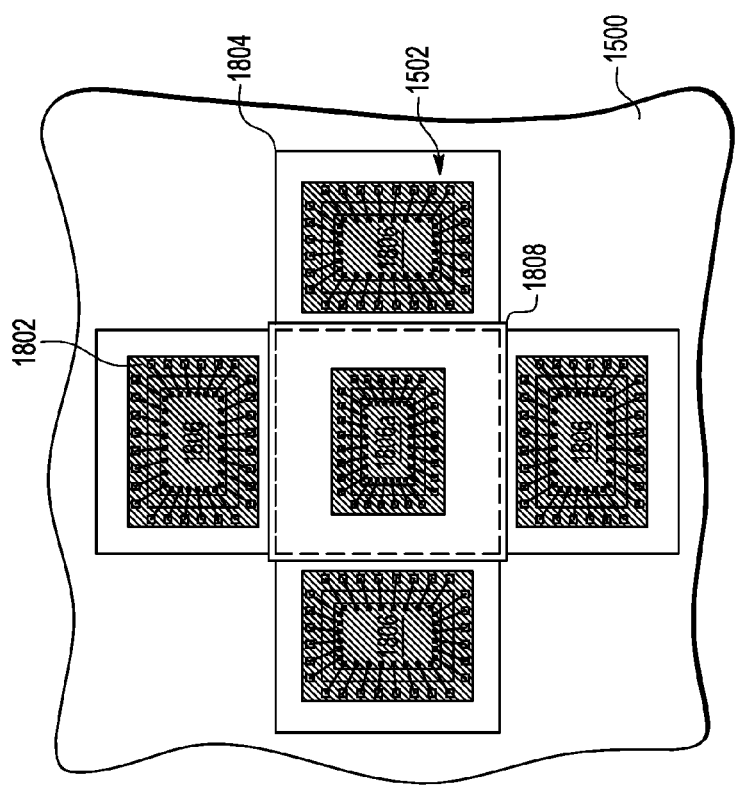

FIG. 18 is a top plan view of the flexible substrate 1502 of FIG. 17 after (i) molding compound 1802 has been applied to each of the five dies 1406, 1406*a* to encapsulate each die 1406, 1406*a* and its corresponding bond wires 1408, 1408*a* into a corresponding die sub-assembly 1806, 1806*a* and (ii) the flexible substrate 1502 has been punched through along a "+"-shaped punch-out pattern 1804 to separate the flexible substrate 1502 from the rest of the flexible substrate array 1500 of FIG. 15.

Figure 19:
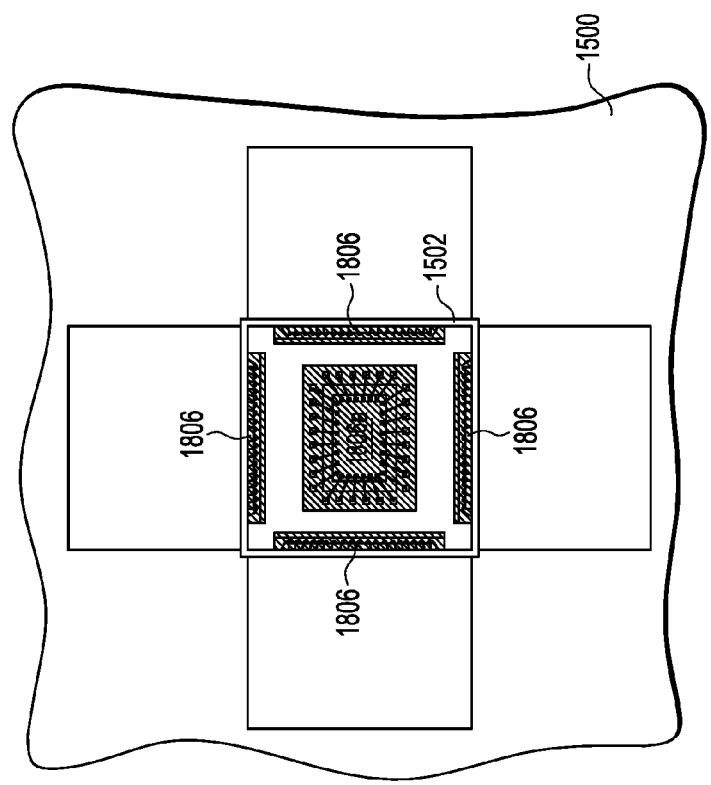
FIG. 19 is a top plan view of the flexible substrate of FIG. 18 after the four encapsulated side die sub-assemblies have been rotated to form the four side walls of the IC package.

FIG. 19 is a top plan view of the flexible substrate 1502 of FIG. 18 after the four encapsulated side die sub-assemblies 1806 have been rotated by 90 degrees relative to the central, base sub-assembly 1806*a* to form the four side walls 1404 of the IC package 1400. In one implementation, a special tooling fixture supports the four side sub-assemblies 1806 while lowering the central, base sub-assembly 1806*a* using an applied vacuum cavity, thereby causing the side sub-assemblies 1806 to rotate by 90 degrees to their vertical orientation. Note that the region 1808 of the flexible substrate 1502 indicated by the dashed lines in FIG. 18 needs to be sufficiently flexible to enable the 90-degree bends without breaking the routing structures 1602 within that region 1808.

Figure 20:
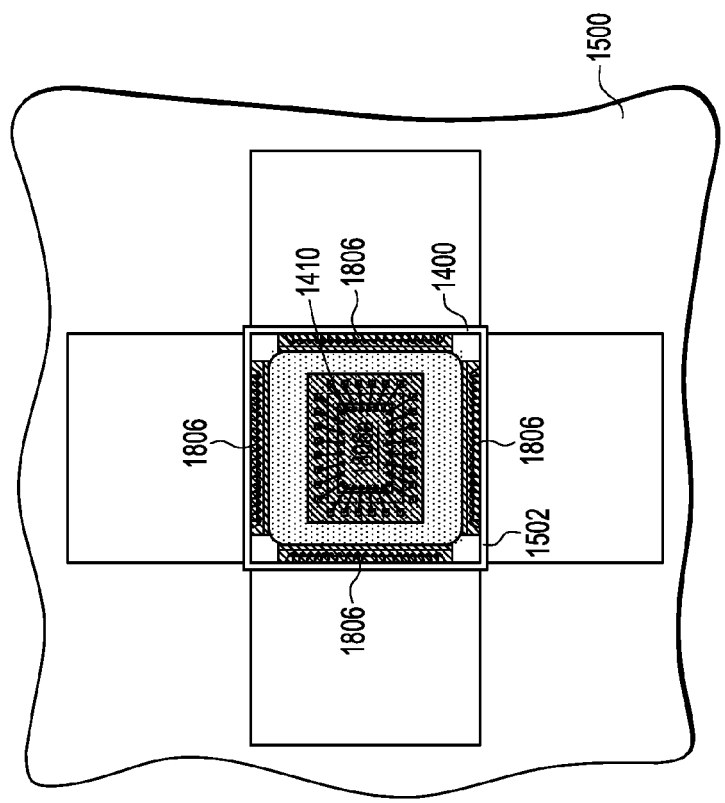
FIG. 20 is a top plan view of the flexible substrate of FIG. 19 after gel has been added to form the final IC package.

FIG. 20 is a top plan view of the flexible substrate 1502 of FIG. 19 after the gel 1410 has been added to the enclosure formed by the central, base die sub-assembly 1806*a* and the four, rotated side die sub-assemblies 1806 to form the final IC package 1400. The gel 1410, which can be any suitable encapsulating material, encapsulates and holds in place the five sub-assemblies 1806, 1806*a*. As described previously, a metal cap such as cap 1200 of FIG. 12 can optionally be applied before the gel has been completely cured.

Although the invention has been described in the context of a flexible substrate having a central, base die pad region 1414*a* surrounded by corresponding bond pads 1418*a*, in other embodiments, the flexible substrate has no such features. Instead, the central, base region may be reserved for routing structures that route electrical signals to and from the other four dies 1406 or it may be used for mounting one or more other electrical components.

Although the presently described embodiment shows the flexible substrate 1502 with a rectangular center, base region surrounded by four rectangular, rotated, side regions, in other embodiments, the shape of the center, base region may be a polygon that accommodates three or more side regions and consequent number of locations for IC dies.

Figure 21:
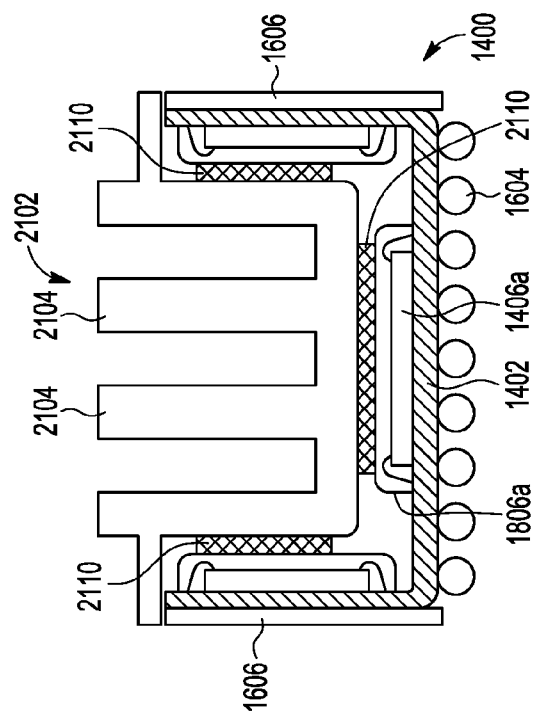
FIG. 21 is a cross-sectional side view of the IC package of FIG. 14 having a finned, metal lid according to an alternative embodiment of the invention.

FIG. 21 is a cross-sectional side view of the IC package 1400 of FIG. 14 having a finned, metal lid 2102 according to an alternative embodiment of the invention. As shown in FIG. 21, the lid 2102 has a number of fins 2104 that extend into the cavity of the IC package 1400. These fins 2104 increase the surface area and therefore the heat dissipation of the lid 2102, while decreasing the amount of gel used in the IC package 1400. In particular, instead of partially filling the cavity with gel 1410 as in FIGS. 14 and 20, a relatively thin layer of thermal gel 2110 is applied to each encapsulated sub-assembly 1806, 1806*a* (e.g., before the side walls 1404 are rotated) to hold the IC package 1400 together and to assist in thermal conduction from the sub-assemblies 1806, 1806*a* to the finned, metal lid 2102.

Figure 22B:
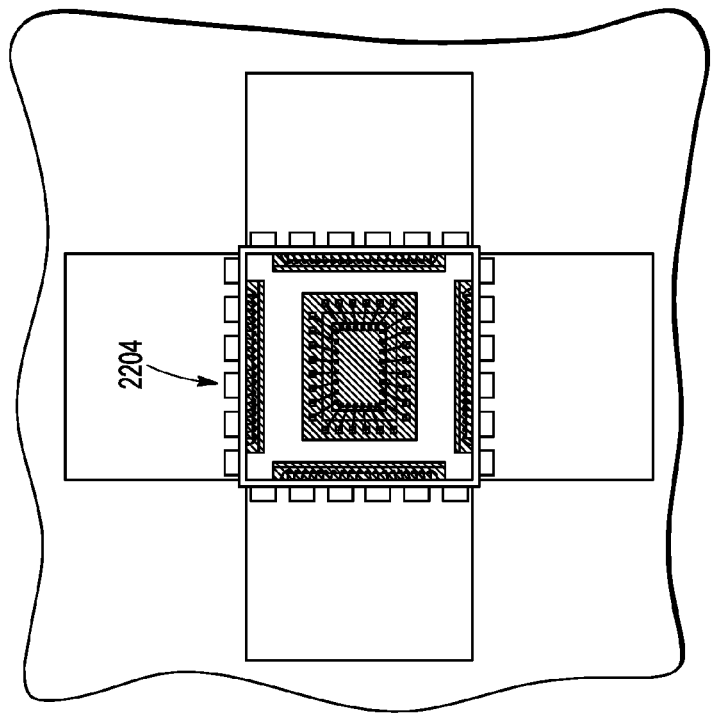
FIG. 22B is a top plan view of an IC package formed using the flexible substrate of FIG. 22A.
Figure 22A:
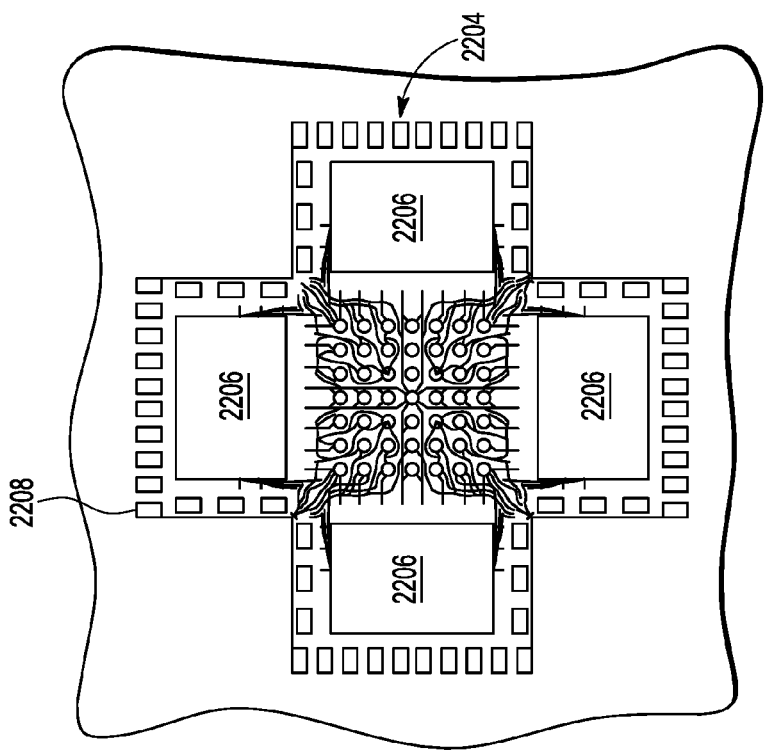
FIG. 22A is a bottom plan view of a flexible substrate according to another embodiment of the invention.

FIG. 22A is a bottom plan view of a flexible substrate 2202 according to another embodiment of the invention. As shown in FIG. 22A, the bottom of the flexible substrate 2202 has a number of (e.g., passive) electrical components 2204 mounted around the periphery of each metal stiffener element 2206 and electrically connected via the routing structures 2208 to other elements of the flexible substrate 2202.

FIG. 22B is a top plan view of an IC package 2200 formed using the flexible substrate 2202 of FIG. 22A. As shown in FIG. 22B, after the four encapsulated sub-assemblies have been rotated or folded up from the flexible substrate 2202, the electrical components 2204 are on the four outer walls of the IC package 2200.

Although the present invention has been described in the context of the IC package 100 of FIG. 1 and the IC package 1400 of FIG. 14, the present invention is not so limited. In general and although not shown in the figures, IC packages of the present invention may or may not have a cap. The cap may be made of metal or plastic. The cap also may have a post and an anchor structure. If the package does not include a pressure sensor, then the package may not have a gel disposed within the enclosure or cavity formed by the base and side walls. Depending on the heat generation characteristics of the package, the package may or may not have one more heat sinks mounted on one or more outer surfaces of the IC package, including the outer surfaces corresponding to the side walls and the cap.

The IC package may have multiple dies that mounted in side-by-side stacks on a rotated die pad, each stack having one or more dies. The IC package may have three or more rotated side walls. The side walls, when rotated, may be vertical or non-vertical relative to the IC package base. The IC package may have one or more side walls that do not have dies mounted on them, and such side walls may be with or without bonding pads. The IC package may include an interposer that provides electrical connections to the outside world via TSVs (through silicon vias) and solder bumps and/or provides die-to-die connections that enable electrical connections between different dies within the IC package.

A lead frame is a collection of metal leads and possibly other elements (e.g., power bars, die paddles also known as die pads and die flags) that is used in semiconductor packaging for assembling one or more integrated circuit (IC) dies into a single packaged semiconductor device. Prior to assembly into a packaged device, a lead frame may have support structures (e.g., a rectangular metal frame and tie bars) that keep those elements in place. During the assembly process, the support structures may be removed. As used herein, the term "lead frame" may be used to refer to the collection of elements before assembly or after assembly, regardless of the presence or absence of those support structures.

Unless explicitly stated otherwise, each numerical value and range should be interpreted as being approximate as if the word "about" or "approximately" preceded the value or range.

It will be further understood that various changes in the details, materials, and arrangements of the parts that have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An integrated circuit (IC) package, comprising:
   a base;
   a plurality of side walls mechanically connected to the base;
   a plurality of IC dies, each mounted on a respective inner surface of a side wall or the base; and
   a plurality of electrical connections, each connecting a corresponding one of the IC dies to another component of the IC package, wherein each side wall having an IC die comprises a metal die pad extending from the inner surface to an outer surface of the side wall.

2. The IC package of claim 1, wherein each IC die mounted on the inner surface of a corresponding side wall is electrically connected with bond wires only to bond pads on the inner surface of the corresponding side wall.

3. The IC package of claim 2, wherein the corresponding side wall further comprises routing structures electrically connecting the corresponding bond pads to routing structures of the base.

4. The IC package of claim 3, wherein the routing structures of the base connect the routing structures of the corresponding side wall to at least one of (i) routing structures of another side wall and (ii) I/O pads on a bottom surface of the base.

5. The IC package of claim 1, wherein:
   the one of the IC dies mounted on the inner surface of the base is electrically connected with bond wires only to bond pads on the inner surface of the base; and
   the base further comprises routing structures electrically connecting the corresponding bond pads to at least one of (i) routing structures of one or more side walls and (ii) I/O pads on a bottom surface of the base.

6. The IC package of claim 1, further comprising a finned, metal lid mounted over the side walls.

7. The IC package of claim 1, further comprising at least one electrical component mounted on an outer surface of at least one side wall.

8. A flexible substrate for an IC package, the flexible substrate comprising:
   a base region having (i) a plurality of first routing structures and (ii) a plurality of I/O pads on a top surface thereof; and
   a plurality of side regions flexibly connected to and co-planar with the base region, at least one side region having (i) a plurality of bond pads and (ii) a plurality of second routing structures electrically connecting the bond pads to the first routing structures, wherein:
   the first routing structures electrically connect the second routing structures to at least one of (i) routing structures of one or more other side regions and (ii) external I/O pads on a bottom surface of the base region; and
   the side regions are rotatable relative to the base region to form side walls of an IC package without breaking any electrical connections between the first and second routing structures.

9. The flexible substrate of claim 8, wherein the at least one side region further comprises a metal die pad extending through the side region, and the plurality of bond pads are adjacent to the die pad and electrically connected to the second routing structures.

10. The flexible substrate of claim 8, wherein the base region comprises:
   a metal die pad not extending through the base region; and
   the I/O pads are adjacent the die pad and electrically connected to the first routing structures.

11. The flexible substrate of claim 8, wherein the flexible substrate is part of a flexible substrate array comprising a plurality of instances of the flexible substrate.

12. The flexible substrate of claim 8, wherein each side region has a stiffener that provides mechanical support to the side region.

13. The flexible substrate of claim 8, comprising a flexible interface between each side region and the base region.

14. The flexible substrate of claim 8, further comprising at least one electrical component mounted on a bottom surface of at least one of the side regions.

15. A method of assembling an IC package, the method comprising:
   (a) providing a flexible substrate, the flexible substrate comprising:
      a base region having (i) a plurality of first routing structures (ii) a plurality of first bond pads on a top surface thereof and (iii) a plurality of I/O pads on a bottom surface thereof; and
      a plurality of side regions flexibly connected to and co-planar with the base region, at least one side region having (i) a plurality of second bond pads and (ii) a plurality of second routing structures selectively electrically connecting the second bond pads to the first routing structures, wherein:
         the first routing structures electrically connect the second routing structures to at least one of (i) routing structures of one or more other side regions and (ii) the I/O pads on the bottom surface of the base region; and
      the side regions are rotatable relative to the base region to form side walls of an IC package without breaking any electrical connections between the first and second routing structures;
   (b) mounting each of a plurality of IC dies on respective ones of the side regions and the base region;
   (c) electrically connecting with bond wires each mounted IC die only to a plurality of the bond pads on the corresponding side region or base region upon which it is mounted; and
   (d) rotating the side regions relative to the base region to form side walls of the IC package.

16. The method of claim 15, wherein, for each IC die mounted on one of the side regions, step (b) comprises mounting the IC die on a metal die pad of the side region, wherein the metal die pad extends through the side region.

17. The method of claim 15, wherein, for an IC die mounted on the base region, step (b) comprises mounting the IC die on a metal die pad of the base region, wherein the metal die pad does not extend through the base region.

18. The method of claim 17, wherein step (d) comprises applying a vacuum to lower the base region within a tooling that enables the side regions to rotate from a horizontal configuration relative to the base region to a vertical configuration relative to the base region.

19. The method of claim 15, wherein:
   step (c) further comprises applying molding compound over each IC die mounted to a side region and its corresponding bond wires prior to step (d); and
   step (d) further comprises disposing gel in an enclosure formed by the base region and the rotated side regions, wherein the gel covers the IC die mounted on the base region.

* * * * *